(12) United States Patent
Chen

(10) Patent No.: US 7,814,566 B2
(45) Date of Patent: Oct. 12, 2010

(54) TIP ARRAY STRUCTURE AND FABRICATING METHOD OF TIP STRUCTURE

(75) Inventor: Wei-Su Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 434 days.

(21) Appl. No.: 11/737,768

(22) Filed: Apr. 20, 2007

(65) Prior Publication Data

US 2008/0160285 A1   Jul. 3, 2008

(30) Foreign Application Priority Data

Dec. 28, 2006   (TW) ............................. 95149449 A

(51) Int. Cl.
 *G01Q 70/16*   (2010.01)
(52) U.S. Cl. ......................... 850/60; 977/875; 438/20; 216/11; 445/46; 445/49; 445/50; 430/330; 430/311
(58) Field of Classification Search ................... 850/55, 850/57, 60; 977/874, 875, 878, 855, 856, 977/857; 438/20; 216/11; 445/50, 46, 49; 313/309; 430/330, 311
See application file for complete search history.

(56) References Cited

U.S. PATENT DOCUMENTS

2004/0023046 A1 *   2/2004   Schlottig et al. ............ 428/469

2008/0166664 A1 *   7/2008   Nomura ...................... 430/311

OTHER PUBLICATIONS

Huq et al., "Fabrication of sub-10 nm silicon tips: A new approach", Journal of Vacuum Science & Technology B, vol. 13, No. 6, Nov./Dec. 1995, pp. 2718-2721.*

Chou et al., "Sub-10 nm imprint lithography and applications", Journal of Vacuum Science & Technology B, vol. 15, No. 6, Nov./Dec. 1997, pp. 2897-2904.*

Wei-Su Chen,Ming-Jer Kao,Ming-Jinn Tsai. "Sub-10 nm Contact Holes with Aspect Ratio over Sixty Formed by E-beam Resist Shrinkage Techniques"/SPIE Advanced lithography 2007, vol. 6519-167 (p.1 of 12).

* cited by examiner

*Primary Examiner*—Jack I Berman
(74) *Attorney, Agent, or Firm*—Jianq Chyun IP Office

(57) ABSTRACT

A fabricating method of a structure having nano-hole is provided. The fabricating method includes: providing a substrate, forming a photoresist layer on the substrate, forming an opening, and performing a heat treatment process on the photoresist layer to shrink the opening to form a nano-hole. The structure having nano-hole fabricated by the method of the present invention can be used to fabricate a nano-tip having a diameter of tip-body of no more than 10 nm, high aspect ratio, and a uniform diameter of tip-body.

15 Claims, 11 Drawing Sheets

TIP ARRAY STRUCTURE AND FABRICATING METHOD OF TIP STRUCTURE

CROSS-REFERENCE TO RELATED APPLICATION

This application claims the priority benefit of Taiwan application serial no. 95149449, filed Dec. 12, 2006. All disclosure of the Taiwan application is incorporated herein by reference

BACKGROUND OF THE INVENTION

1. Field of the Invention

The present invention relates to a structure having nano-hole and a fabricating method thereof, a tip array structure and a fabricating method of a tip structure. More particularly, the present invention relates to a structure having nano-hole and a fabricating method thereof, a tip array structure and a fabricating method of a tip structure, in which a nano-hole or tip-body has a diameter no more than 10 nm, high aspect ratio, and a uniform diameter of nano-hole or tip-body.

2. Description of Related Art

The nano-tip products are widely used. Currently, there are at least four types of fabricating instruments and measuring instruments and technologies using the nano-tip including: (1) atomic force microscopy (AFM) and AFM Lithography; (2) scanning electron microscopy (SEM)/transmission electron microscopy (TEM); (3) MAPPER Lithography (a company name, mainly refers to a device utilizing nano-tip array); and (4) nano-imprint, nano-tip mold, and so on.

The above instruments mainly applies the nano-tip to a field emission (FE) source of an electron beam, a contact probe, or an imprint tip. Moreover, the field emission display (FED), field emission LED, and plasma display panel (PDP) also adopt a carbon nano-tube nano-tip array (CNT nano-tip array) to enhance the intensity of light emission.

However, currently, the tip array density of the nano-tip cannot catch up with the density of a contact hole or via hole array of a common IC, and it is more difficult to realize a nano-tip top end having a diameter no more than 10 nm. Moreover, it is especially difficult realize a nano-imprint model meeting the requirements of super high tip array density, nano-tip top end of no more than 10 nm, and a tip having an aspect ratio greater than 60. The difficulties are originated from that the nano-tip is made of silicon through anisotropic dry/wet (KOH) etching, and the material selection of the tip is limited. Moreover, since the tip formed is cone-shaped, when a tip array is formed, the density of the tip array cannot be further improved.

SUMMARY OF THE INVENTION

Accordingly, the present invention is directed to a structure having nano-hole and a fabricating method thereof, which can be used to fabricate a structure having nano-hole that has a nano-hole with a diameter no more than 10 nm, high aspect ratio, and a uniform diameter.

The present invention is further directed to a structure having nano-hole and a fabricating method thereof, which can be used to fabricate a structure having nano-hole with high nano-hole array density.

The present invention is further directed to a tip array structure and a fabricating method of a tip structure, which can be used to fabricate a tip array structure with a tip-body having a diameter no more than 10 nm, high aspect ratio, and uniform diameter.

The present invention is further directed to a structure having nano-hole and a fabricating method thereof, and a tip array structure and a fabricating method of a tip structure, which can be used to fabricate a structure having nano-hole or a tip structure in a high throughput.

The present invention is directed to a structure having nano-hole which at least includes a substrate and a photoresist layer. The photoresist layer is disposed on the substrate, in which the nano-hole is formed in the photoresist layer, the diameter of the nano-hole is no more than 10 nm, and the nano-hole has a same diameter in a range of above 80% of the hole-height from the end of the nano-hole.

The present invention is directed to a fabricating method of a structure having nano-hole, which includes providing a substrate; forming a photoresist layer on the substrate; forming an opening in the photoresist layer; and performing a heat treatment process on the photoresist layer to shrink the opening to form a nano-hole.

The present invention is directed to a tip array structure, which at least includes a substrate and a plurality of tip-bodies. The plurality of tip-bodies is disposed in an array on the substrate. The diameter of the tip-body is no more than 10 nm. The density of the tip-body array is greater than 40 (tip number/$\mu m^2$). The tip-body has a same diameter in a range of above 80% of the hole-height from the end of the tip-body.

The present invention is directed to a fabricating method of a tip structure, which includes providing a substrate, forming a photoresist layer on the substrate, forming an opening in the photoresist layer, performing a heat treatment process on the photoresist layer to shrink the opening to form a nano-hole, forming a conductive layer in the nano-hole, and removing the photoresist material layer to form the tip structure.

As described above, since according to the present invention, the opening before shrinking can be written by a large electron beam current, the write yield of the initial critical dimension (CD) of the opening is greatly increased.

Moreover, according to the present invention, the nano-hole fabricated by the method can have a diameter no more than 10 nm, high aspect ratio, and uniform diameter, and the high density nano-hole array can be formed.

Furthermore, the a tip-body of the tip array structure fabricated by the method of the present invention can have a diameter no more than 10 nm, high aspect ratio, and uniform diameter, and a high density tip-body array can be formed.

Additionally, the fabricating method according to the present invention is compatible with the semiconductor process, and has a wide application. Furthermore, the material for forming the tip-body of the tip structure according to the present invention can be selected in a wide range, and a metal material with good conductivity can be selected.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A to FIG. 2C are the top views of FIG. 1A to FIG. 1C, in which FIG. 1A to FIG. 1C are cross-sectional view of FIG. 2A to FIG. 2C taken along a I-I line.

FIG. 4A to FIG. 4E are top views of FIG. 3A to FIG. 3E, in which FIG. 3A to FIG. 3E are cross-sectional views of FIG. 4A to FIG. 4E taken along a II-II line.

DESCRIPTION OF EMBODIMENTS

The First Embodiment

Figure 1A:
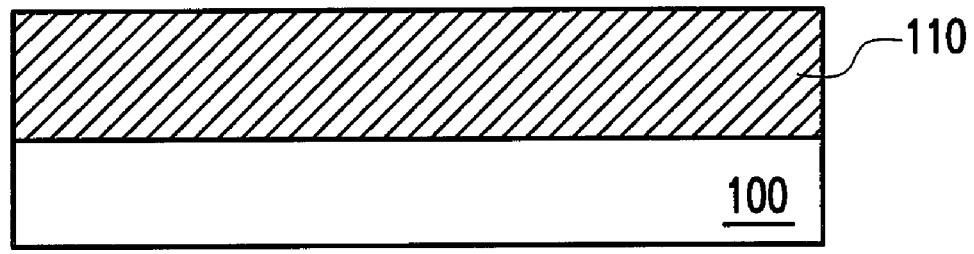
FIG. 1A to FIG. 1C are schematic cross-sectional views of a fabricating method of a structure having nano-hole according to an embodiment of the present invention.
Figure 1B:
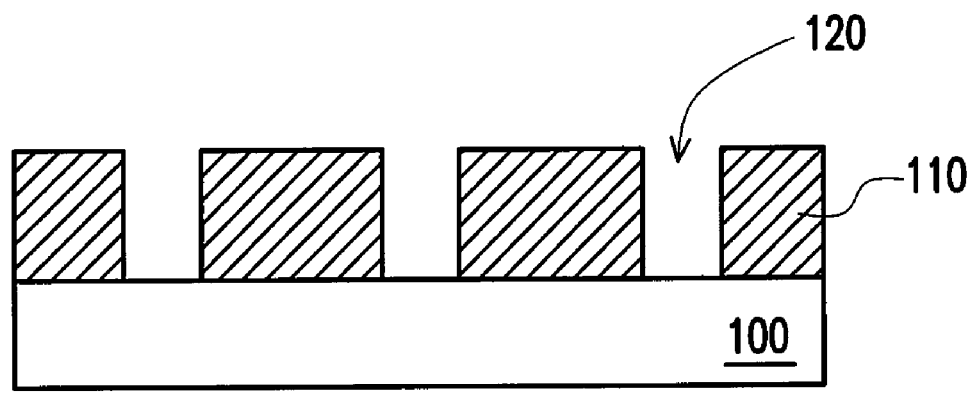
Figure 1C:
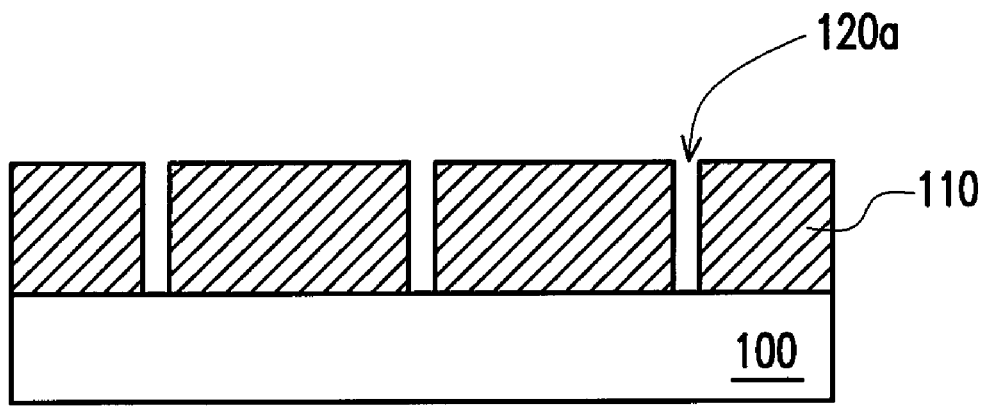

FIG. 1A to FIG. 1C are schematic cross-sectional views of a fabricating method of a structure having nano-hole according to an embodiment of the present invention. And FIG. 2A to FIG. 2C are top views of FIG. 1A to FIG. 1C, in which FIG. 1A to FIG. 1C are cross-sectional views of FIG. 2A to FIG. 2C taken along a I-I line.

Figure 2A:
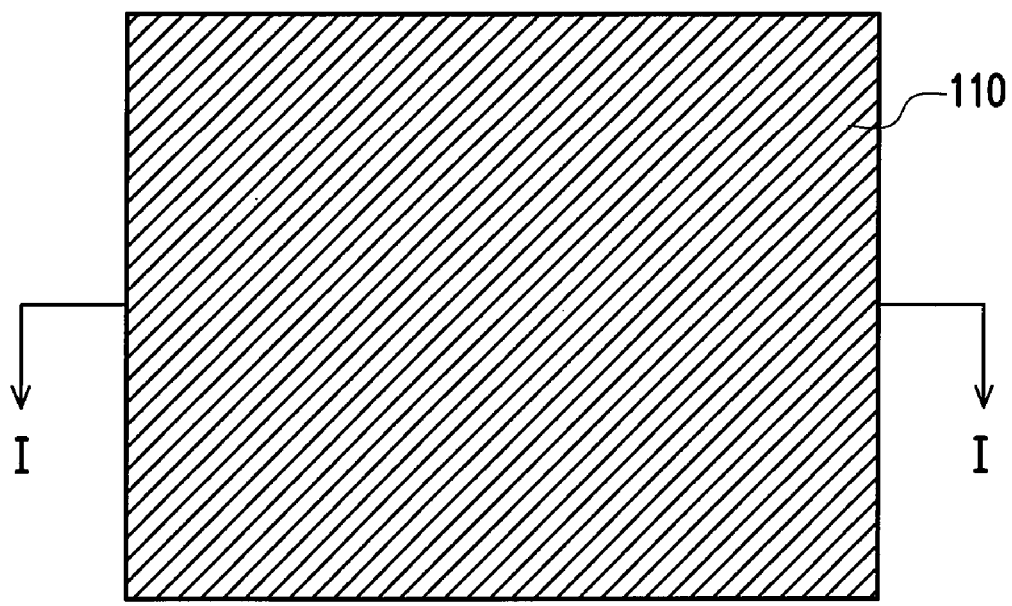

Referring to FIG. 1A and FIG. 2A together, firstly, a substrate 100 is provided, and a photoresist layer 110 is formed on the substrate 100. The material of the substrate 100 is, for example, silicon or an isolating material, and the isolating material is, for example, silica. The method for forming a photoresist layer 110 on the substrate 100 is, for example, a common spin-coating method, and the material of the photoresist layer 110 is, for example, E-beam chain scission photoresist or deep ultraviolet light (UV-light) chemical amplified photoresist.

Figure 2B:
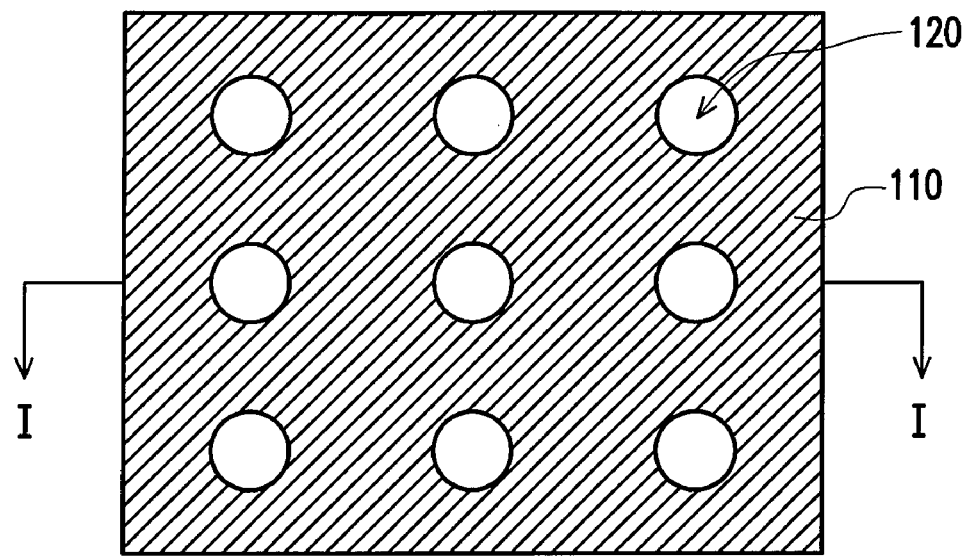

Then, referring to FIG. 1B and FIG. 2B together, an opening 120 is formed in the photoresist layer 110. The way for forming the opening 120 in the photoresist layer 110 includes, for example, directly writing the photoresist layer 110 with an electron beam through an electron beam writing method, and then forming the opening 120 in the photoresist layer 110 through a development process. The electron beam writing current used in the electron beam writing method ranges, for example, from 0.1 pA to 1 mA, and the diameter of the opening 120 formed is, for example, greater than 40 nm.

Figure 2C:
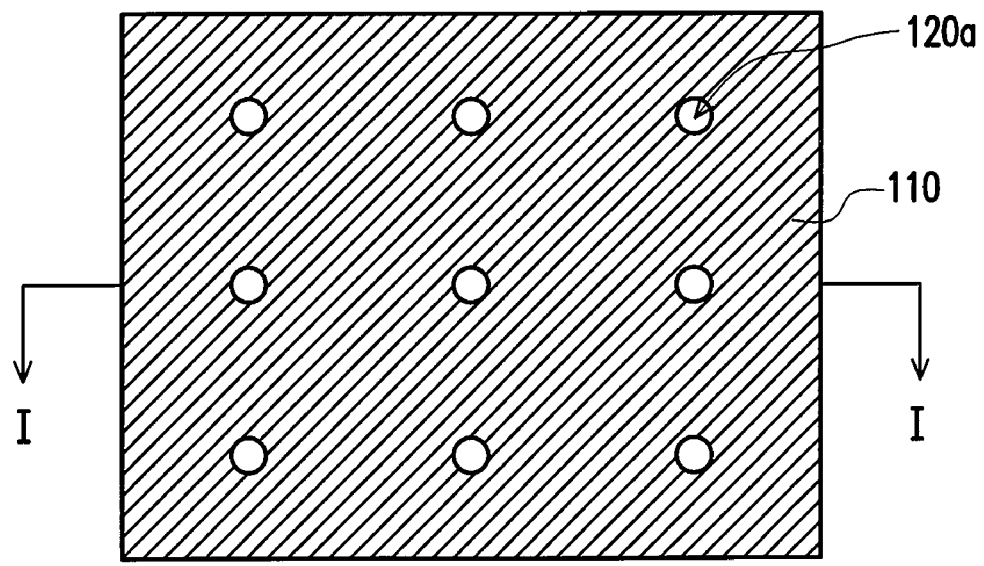

And then, referring to FIG. 1C and FIG. 2C together, a heat treatment process is performed on the photoresist layer 110 to shrink the CD of the opening 120 to a nano-hole 120a. The heat treatment process is, for example, thermal reflow process or shrink assist film for enhanced resolution (SAFIER) process. Moreover, for the opening 120 (i.e., an initial hole before shrinking) with an opening diameter greater than 100 nm, the operating temperature of the heat treatment process is, for example, from 140° C. to over 170° C. While for the opening 120 (i.e., an initial hole before shrinking) with an opening diameter from 40 to 100 nm, the operating temperature of the heat treatment process is, for example, from 140° C. to 170° C. Moreover, the diameter of the nano-hole 120a formed by the thermal process is, for example, no more than 25 nm, and preferably no more than 10 nm. The thermal reflow process includes, for example, heating the photoresist layer 110 in a common baking device. And the SAFIER process includes, for example, forming a top coating film (not shown), and heating the photoresist layer 110 and the top coating film, and then removing the top coating film.

It should be particularly noted that since the photoresist material used in the present invention, such as E-beam chain scission photoresist or deep UV-light chemical amplified photoresist has some characteristics that have not been found before. That is to say, a larger opening 120 formed in the photoresist layer 110, and the opening 120 after being subjected to a heat treatment process for a sufficient time will shrink to have a diameter no more than 10 nm. However, the nano-hole 120a shrinking to have diameter no more than 10 nm will reach a saturated value without being closed, so as to form the nano-hole 120a with diameter no more than 10 nm in the photoresist layer 110.

Accordingly, as compared with the conventional technology in which it is necessary to use a minimal electron beam dimension and writing current to form an opening of no more than 50 nm, due to the characteristic described above, when forming the photoresist layer 110, the thickness of the photoresist layer 110 is formed to be up to about 400 nm, and in the process for forming the opening 120, the larger opening 120 can be formed with a larger electron beam writing current. Therefore, the rate of forming the opening 120 according to the present invention can be improved greatly.

Moreover, it should be noted that in this embodiment, as the nano-hole 120a, which is obtained by the opening 120 after being subjected to the heat treatment process according to the present invention, can have a diameter no more than 10=n, the nano-hole 120a of the present invention has an aspect ratio greater than 30, preferably greater than 60. Further, the nano-hole 120a, which is obtained after the heat treatment process according to the present invention, has a good CD uniformity. Therefore, a profile having the same diameter in a range of above 80% of the hole-height from the end of the nano-hole 120a (substrate end) is obtained, and the vertical degree of the nano-hole 120a can reach 85 to 90 degrees.

Furthermore, it is still should be noted that in this embodiment, the technology using the electron beam writing photoresist is a mature technology that is compatible with the semiconductor process. Accordingly, when forming the opening 120, an opening 210 array with high density is formed in the photoresist layer 110, and after shrinking through the heat treatment process, the nano-hole 120a array according to the present invention has a line/space ratio greater than 1/20, and a density greater than 40 (holes/$\mu m^2$). In this way, the structure having nano-hole formed by the fabricating method of the structure having nano-hole can form a nano-hole array with high density.

A fabricating method of a tip structure developed based on the process of the structure having nano-hole will be illustrated with reference to the above description of the structure having nano-hole and the fabricating method thereof.

The Second Embodiment

Figure 1D:
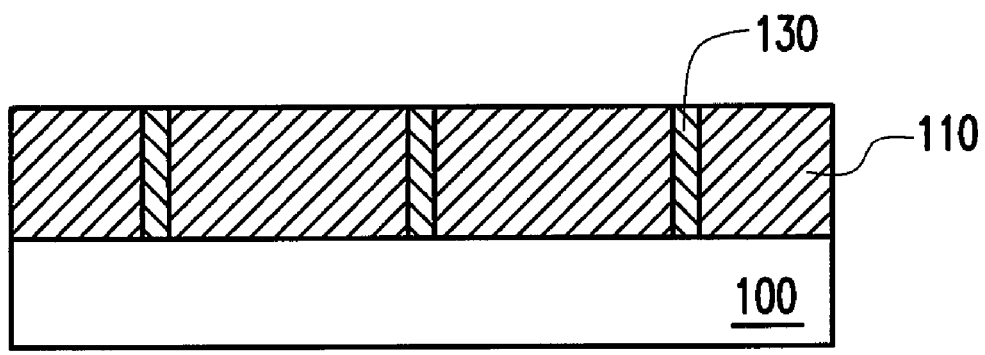
FIG. 1D to FIG. 1E and FIG. 2D to FIG. 2E are schematic cross-sectional views of a fabricating method of a tip structure according to an embodiment of the present invention.
Figure 1E:
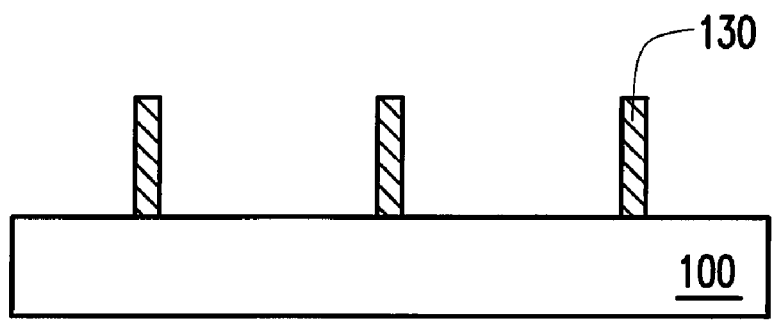
Figure 2D:
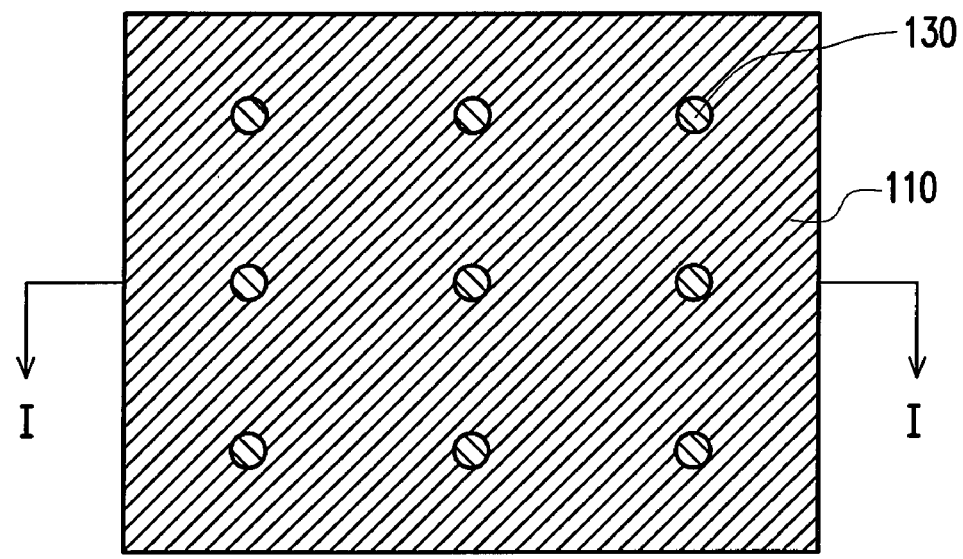

FIG. 1D to FIG. 1E are schematic cross-sectional views of a fabricating method of a tip structure according to an embodiment of the present invention. And FIG. 2D to FIG. 2E are the top views of FIG. 1D to FIG. 1E, in which FIG. 1D to FIG. 1E are the cross-sectional views of FIG. 2D to FIG. 2E taken along a I-I line.

First, the structures having nano-hole as shown in FIG. 1C to FIG. 2C are formed according to the first embodiment. Referring to FIG. 1D and FIG. 2D, together, a conductive layer 130 is formed in the opening 120a. The method for forming the conductive layer 130 in the nano-hole 120a includes, for example, forming a metal seed (not shown) in the nano-hole 120a; and then further forming a conductive layer 130 with the existence of the metal seed. Moreover, the method for forming the metal seed in the nano-hole 120a is, for example, chemical fluid deposition (CFD), the material of the metal seed is, for example, palladium. The method for forming the conductive layer 130 with the existence of the metal seed is, for example, CFD. The material of the conductive layer 130 is, for example, copper, platinum, palladium, gold, nickel, or cobalt. The CFD includes, for example, dissolving a soluble organic metal compound carried by $H_2$ into a supercritical $CO_2$; forming the metal particles in the nano-hole 120a; and further forming the conductive layer 130 filled out the nano-hole 120a with the metal particles (in this embodiment, palladium) as seed through CFD.

Figure 2E:
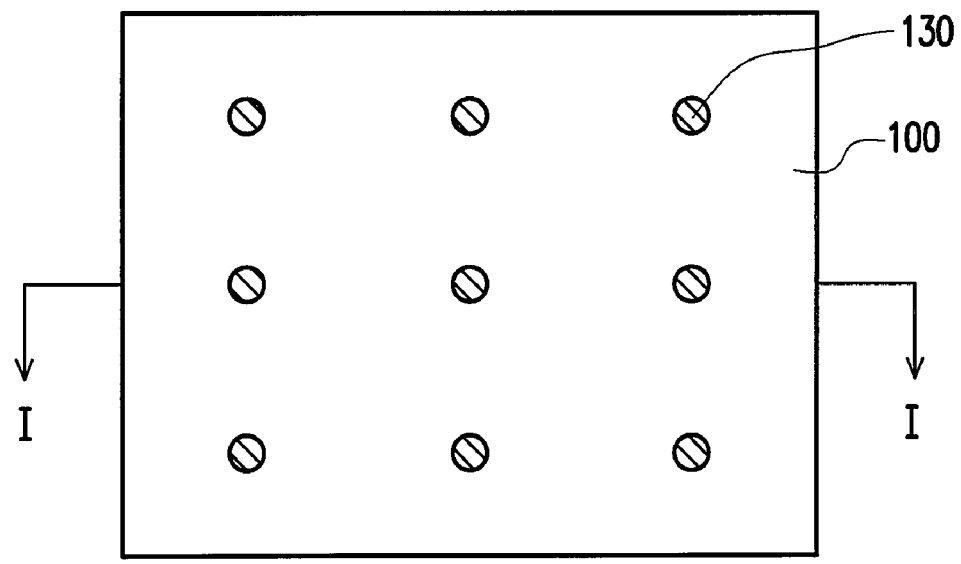

And then, referring to FIG. 1E and FIG. 2E together, the photoresist layer 110 is removed, so that the conductive layer 130 assumes a tip structure. And the method for removing the photoresist layer 110 is performed, for example, an oxygen plasma process.

The Third Embodiment

FIG. 3A to FIG. 3E are schematic cross-sectional views of a fabricating method of a tip structure according to another embodiment of the present invention. And FIG. 4A to FIG. 4E are top views of FIG. 3A to FIG. 3E, in which FIG. 3A to FIG. 3E are cross-sectional views of FIG. 4A to FIG. 4E taken along a II-II line.

Figure 3A:
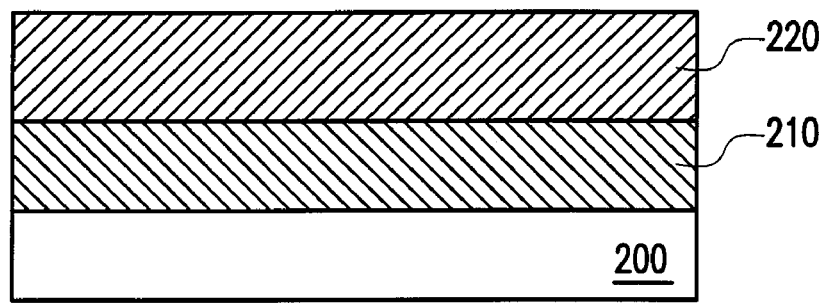
FIG. 3A to FIG. 3E are schematic cross-sectional views of a fabricating method of a tip structure according to another embodiment of the present invention.
Figure 4A:
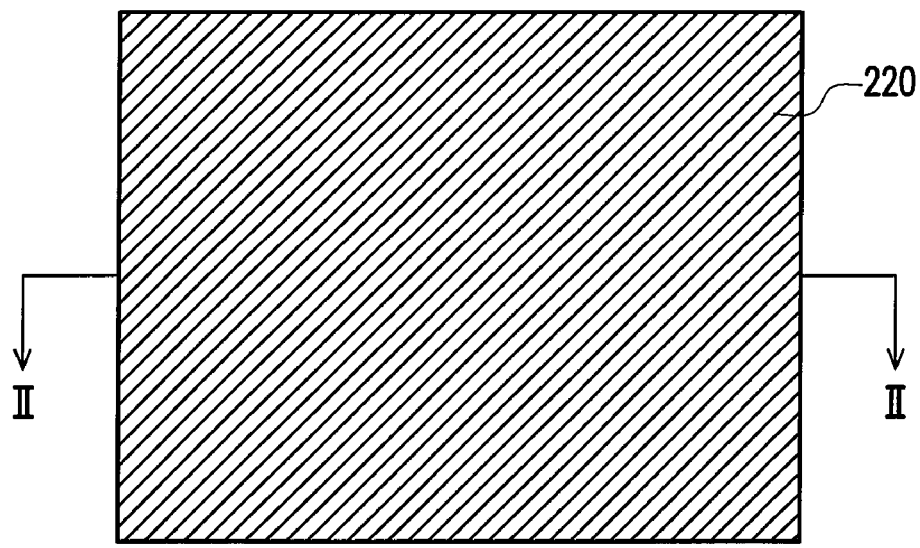

Referring to FIG. 3A and FIG. 4A together, first, a substrate 200 is provided, and a seed layer 210 is formed on the substrate 200, and then a photoresist layer 220 is formed on the seed layer 210. The material of the seed layer 210 is, for example, platinum or palladium, and the method for forming the seed layer 210 is, for example, sputtering. The material and forming method of the substrate 200 and the photoresist layer 220 are the same as those described in the first embodiment.

Figure 3B:
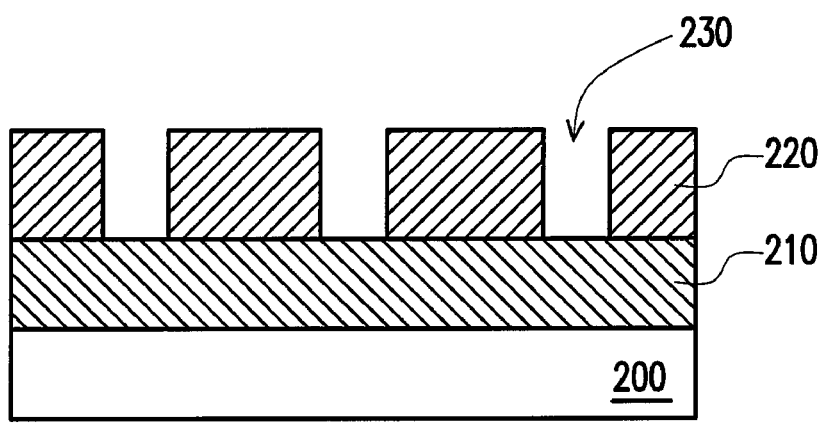
Figure 4B:
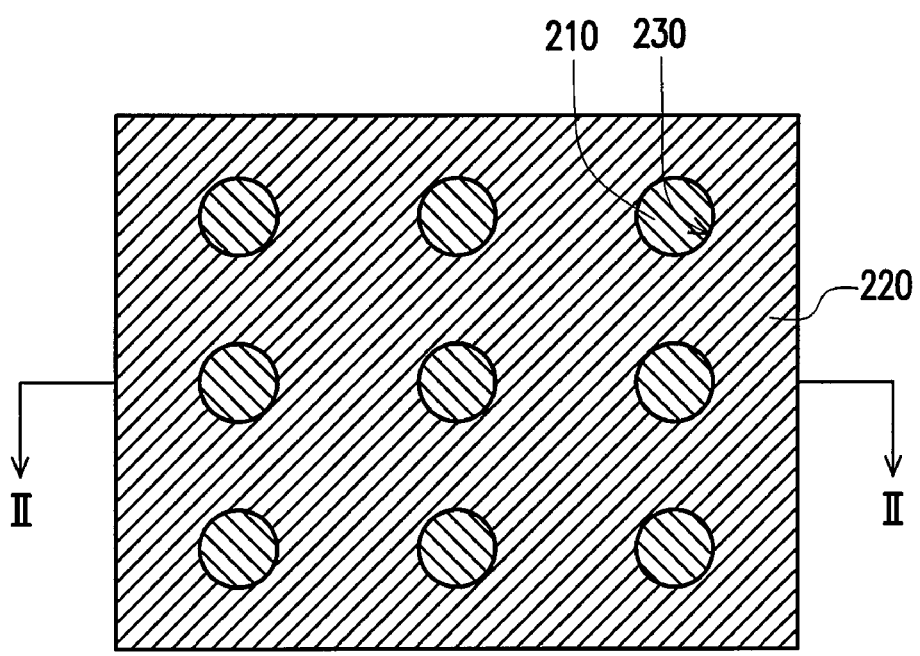

Then, referring to FIG. 3B and FIG. 4B together, an opening 230 is formed in the photoresist layer 210. And the manner and operating parameter for forming the opening 230 in the photoresist layer 110 are the same as those described in the first embodiment.

Figure 3C:
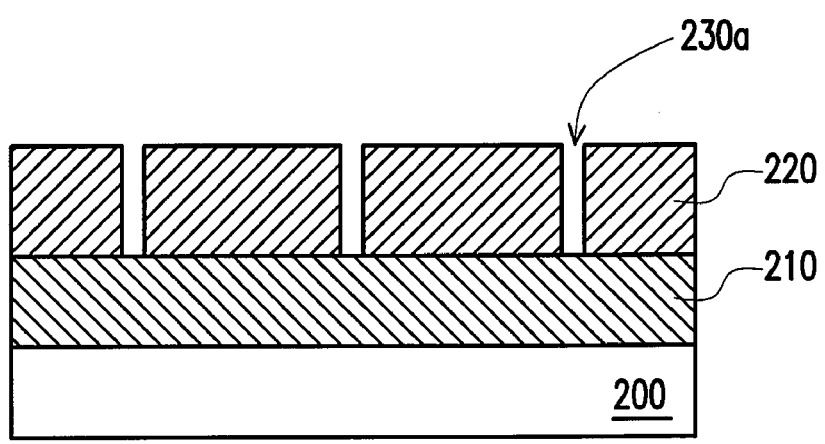
Figure 4C:
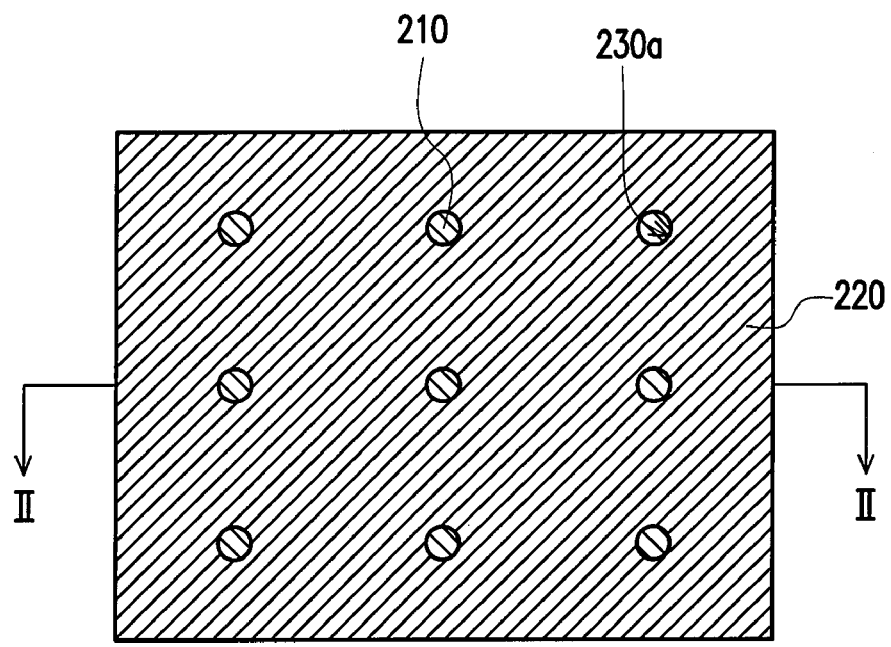

And then, referring to FIG. 3C and FIG. 4C together, a heat treatment process is performed on the photoresist layer 110 to shrink the opening 230 to form a nano-hole 230a. The heat treatment process and the operating parameters thereof are the same as those described in the first embodiment.

Figure 3D:
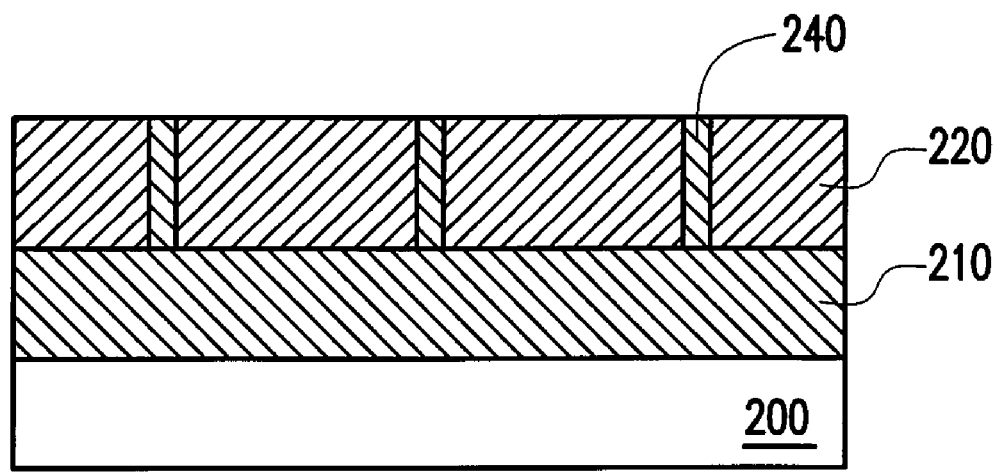
Figure 4D:
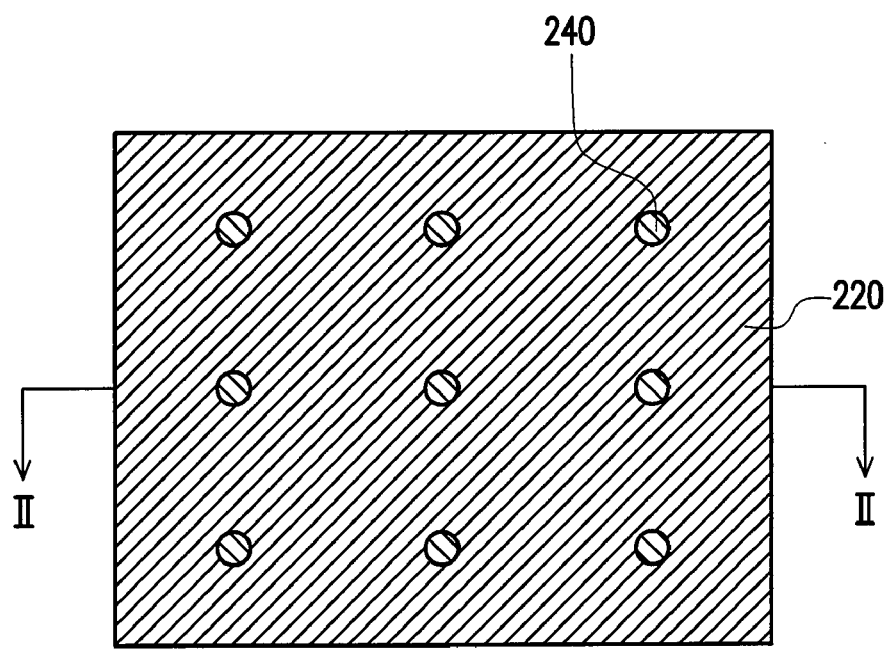

And then, referring to FIG. 3D and FIG. 4D together, a conductive layer 240 is formed in the nano-hole 230a. The material of the conductive layer 240 is, for example, copper, platinum, palladium, gold, nickel, or cobalt. And the method for forming the conductive layer 240 in the nano-hole 230a is, for example, CFD. The CFD includes, for example, dissolving a soluble organic metal compound carried by $H_2$ into a supercritical $CO_2$; selectively reducing the metal compound into metal on the surface of the seed layer 210 (platinum or palladium in this embodiment); and further forming the conductive layer 240 filled out the nano-hole 230a.

Figure 3E:
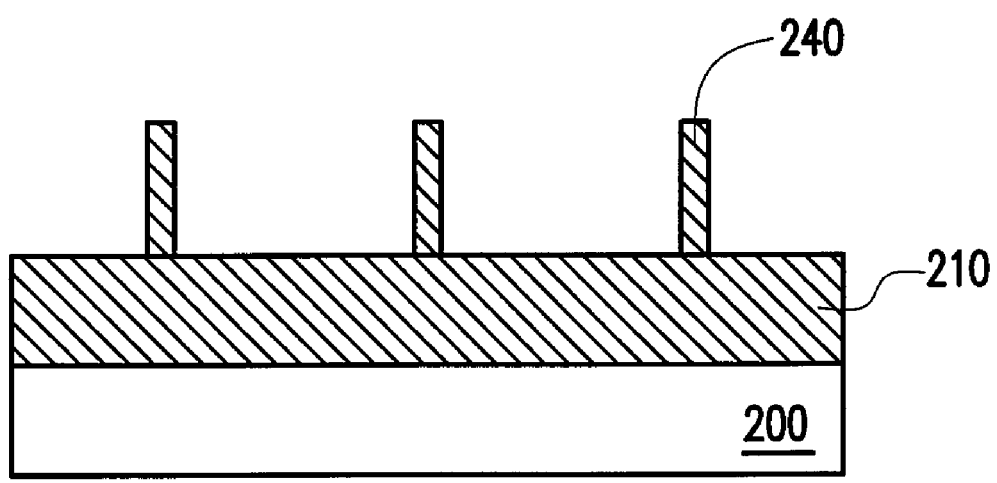
Figure 4E:
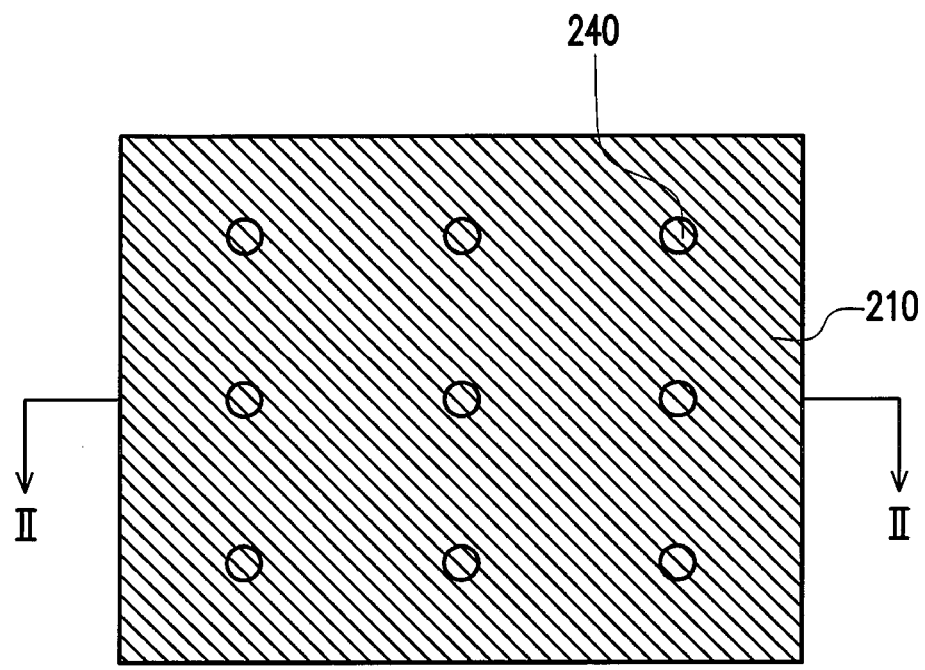

And then, referring to FIG. 3E and FIG. 4E together, the photoresist layer 220 is removed, such that the conductive layer 130 assumes a tip structure. And the method for removing the photoresist layer 220 is, for example, an oxygen plasma process.

It should be noted that in the second and third embodiments since the metal deposition is performed by CFD, even if the CD of the nano-hole 230a is no more than 10 nm, the conductive layer 240 can also be formed in the micro nano-hole 230a according to the present invention.

Furthermore, it should be particularly noted that in the second and third embodiments, due to the characteristics of the nano-hole 120a mentioned in the first embodiment, the tip-body (conductive layer 240) of the tip structure can have an aspect ratio greater than 30, preferably greater than 60, and the tip-body has a same diameter in a range of above 80% of the hole-height from the end (substrate end) of the tip-body 240, and the vertical degree of the tip-body 240 can reach 85 to 90 degrees. As compared with cone-shaped probe in prior art, the structure of the tip-body according to the present invention will facilitate to improve the density of the tip-body array.

Moreover, the high density nano-hole array constructed according to the first embodiment, the fabricating method of the tip-body array according to the second and third embodiments will achieve the tip-body array having a line/space ratio greater than 1/20, and a density greater than 40 (tip number/ $\mu m^2$).

A varied embodiment of the process of the structure having nano-hole is illustrated with reference to the description of the fabricating method of the tip structure and the tip-body array structure according to the present invention.

The Fifth Embodiment

Figure 5:
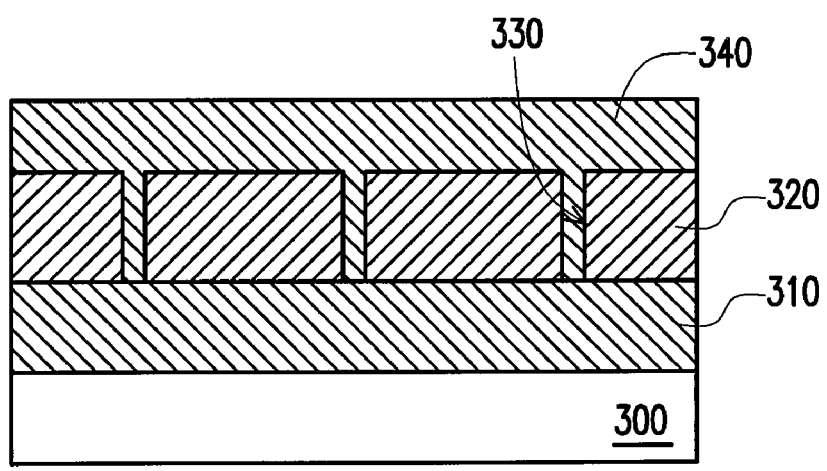
FIG. 5 is a schematic cross-sectional view of another application of the structure having nano-hole according to the present invention.

FIG. 5 is a schematic cross-sectional view of another application of the structure having nano-hole according to the present invention. In this embodiment, the structure having nano-hole according to the present invention is applied to an interconnect structure. In FIG. 5, at least one patterned lead 310 is formed on a substrate 300, and then a photoresist layer 320 having nano-hole 330 is formed according to the process disclosed in the first or second embodiment, in which the nano-hole 330 in a photoresist layer 320 is used as a contact hole or via hole.

And then, a seed layer (not shown) is formed on the overall surface of a photoresist layer 320 by CFD, in which the metal suitable for forming the seed layer is, for example, palladium. Then, a conductive layer 340 filled out a nano-hole 330 is formed by CFD continuously. The metal for the conductive layer 340 can be properly altered in consideration of the cost, and can be, for example, copper, platinum, palladium, gold, nickel, or cobalt. After that, the conductive layer 340 is patterned to form the lead, and an interconnect structure is thus formed. Furthermore, when the structure constituted by the metal lead layer and via plug is stable enough, the photoresist layer 320 can also be removed to form an air gap, thereby further reducing the dielectric constant.

Experimental Example

The experimental example of the nano-hole formed according to the present invention is disclosed. However, the protection scope of the present invention will not be limited by the following experiments.

First, a photoresist layer (the photoresist is E-beam chain scission photoresist, tradename ZEP520A) is formed on a substrate by spin-coating at a rotation rate of 3200 rpm, and baked at 70° C. for 60 sec, so as to obtain the photoresist layer with a thickness of about 410 nm. And then, the photoresist layer is written with a plurality of openings with a diameter distribution from 40 nm to 100 nm by using Gauss e-beam system at the operating conditions of an accelerating voltage of 100 kV, an E-beam current of 2 nA, and a dosage of 150-290 $\mu C/cm^2$.

After the electron beam writing, the photoresist layer is developed for 360 sec, and then cleaned, and baked after being developed at 140° C. for 180 sec, to obtain the photoresist layer having openings of initial CD. After that, the thermal reflow process (heating by the baking device) and the SAFIER process (using FSC-8000GM (tradename) as top coating material) are performed on the photoresist layer with the operating parameter of 160° C. for 90 sec for several times, and the variation of the value of the initial CD of the openings is measured, and the results are as shown in FIG. 6.

Figure 6:
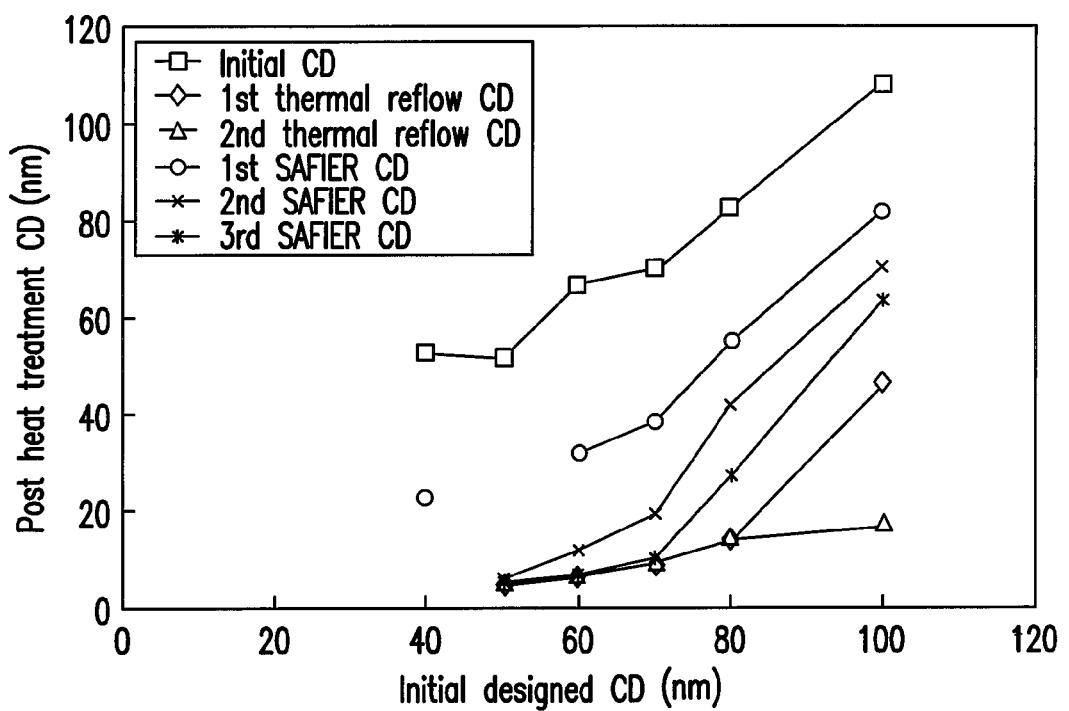
FIG. 6 is a schematic cross-sectional view of the dimension variation of the critical dimension of the opening after the heat treatment process according to the present invention.

As shown in FIG. 6, the CD of the openings will finally stop at the final CD (saturated value), and will not shrink with the progress of the thermal process. The larger the initial CD, the larger the final CD is. In addition, when the CD is designed to be 50 nm initially, the minimum CD obtained is 5.8=m, and the aspect ratio of the minimal nano-hole is greater than 60.

As described above, the structure having nano-hole according to the present invention and the fabricating method, the tip array structure and the fabricating method of the tip structure at least have the following advantages.

(1) Since the initial CD before shrinking according to the present invention can be written by a large E-beam current, the write yield of the opening CD is improved greatly.

(2) The nano-hole fabricated by the method of the present invention can have a diameter no more than 10 nm, an aspect ratio greater than 60, and a same diameter in a range of above 80% of the hole-height, and the vertical degree of the nano-hole can be 85 to 90 degrees.

(3) The high density nano-hole array can be formed according to the present invention, and a line/space ratio of the nano-hole array can be greater than 1/20, and the density is greater than 40 (holes/$\mu m^2$).

(4) The tip-body of the tip structure formed according to the present invention can have an aspect ratio greater than 30, preferably greater than 60, and the tip-body has the same diameter in a range of above 80% of the hole-height from the end (substrate end) of the tip-body, and the vertical degree of the tip-body can reach 85 to 90 degrees. Compared with the cone-shaped probe in prior art, the structure of the tip-body according to the present invention will facilitate the improvement of the density of the tip-body array.

(5) The high density tip-body array can be formed in the present invention, and a line/space ratio of the tip-body array is greater than 1/20, and a density is greater than 40 (holes/$\mu m^2$).

(6) The material for forming the tip-body can be selected in a wide range, and a metal material with good conductivity can be selected.

(7) The process of the present invention is compatible with the semiconductor process, so the high voltage IC above KV can be used as the voltage resource of field emission nano-tip array (FE nano-tip array) on the silicon substrate, thus being used as E-beam emission resource of MAPPER lithography device.

(8) Since the density of the nano-tip array can be improved greatly, the performance of the device using the structure of the present invention as the E-beam emission resource can be greatly improved. Additionally, the E-beam current density used in the electron gun of the AFM or SEM/TEM can be improved greatly, and an emission resource with multiple tips can be formed. And, the luminous intensity used in the FED and FE-LED is also increased due to the enhancement of the E-beam emission density.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabricating method of a tip structure, comprising:
providing a substrate;
forming a photoresist layer on the substrate;
forming an opening in the photoresist layer;
performing a heat treatment process on the photoresist to shrink the opening to a nano-hole;
forming a conductive layer in the nano-hole; and
removing the photoresist material layer to form a tip structure.

2. The fabricating method of the tip structure as claimed in claim 1, wherein the material of the photoresist layer comprises E-beam chain scission photoresist or deep UV-light chemical amplified photoresist.

3. The fabricating method of the tip structure as claimed in claim 1, wherein the process for forming an opening comprises electron beam writing method.

4. The fabricating method of the tip structure as claimed in claim 3, wherein an electron beam writing current of the electron beam of the electron beam writing method ranges from 0.1 pA to 1 mA.

5. The fabricating method of the tip structure as claimed in claim 1, wherein the heat treatment process comprises thermal reflow process or SAFIER process.

6. The fabricating method of the tip structure as claimed in claim 1, wherein the process for forming the conductive layer in the nano-hole comprises:
forming a metal seed in the nano-hole; and
forming the conductive layer in the nano-hole with the metal seed as a seed.

7. The fabricating method of the tip structure as claimed in claim 6, wherein the process for forming the metal seed in the nano-hole comprises chemical fluid deposition (CFD).

8. The fabricating method of the tip structure as claimed in claim 6, wherein the material of the metal seed comprises palladium.

9. The fabricating method of the tip structure as claimed in claim 6, wherein the process for forming the conductive layer in the nano-hole with the metal seed as a seed comprises CFD.

10. The fabricating method of the tip structure as claimed in claim 1, wherein the material of the conductive layer comprises copper, platinum, palladium, gold, nickel, or cobalt.

11. The fabricating method of the tip structure as claimed in claim 1, further comprising forming a seed layer on the substrate before forming the photoresist layer.

12. The fabricating method of the tip structure as claimed in claim 11, wherein the material of the seed layer comprises platinum or palladium.

13. The fabricating method of the tip structure as claimed in claim 11, wherein the method for forming a conductive layer in the nano-hole comprises CFD.

14. The fabricating method of the tip structure as claimed in claim 11, wherein the material of the conductive layer comprises copper, platinum, palladium, gold, nickel, or cobalt.

15. The fabricating method of the tip structure as claimed in claim 1, wherein a step of forming an opening comprises forming an array of openings in the photoresist layer.

* * * * *